United States Patent
Takenaka

(10) Patent No.: US 10,348,189 B2
(45) Date of Patent: Jul. 9, 2019

(54) OSCILLATION CIRCUIT

(71) Applicant: Rohm Co., Ltd., Kyoto (JP)

(72) Inventor: Seiji Takenaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 199 days.

(21) Appl. No.: 15/428,333

(22) Filed: Feb. 9, 2017

(65) Prior Publication Data

US 2017/0229079 A1    Aug. 10, 2017

(30) Foreign Application Priority Data

Feb. 10, 2016    (JP) ................. 2016-023559

(51) Int. Cl.
| | |
|---|---|
| H02M 1/44 | (2007.01) |
| H03K 3/03 | (2006.01) |
| H03K 4/50 | (2006.01) |
| H03B 23/00 | (2006.01) |

(52) U.S. Cl.
CPC .............. *H02M 1/44* (2013.01); *H03B 23/00* (2013.01); *H03K 3/0315* (2013.01); *H03K 4/50* (2013.01)

(58) Field of Classification Search
CPC .. H03K 3/0315; H03K 3/0322; H03K 3/0231; H03L 7/0995; H02M 1/44; H03B 23/00
See application file for complete search history.

(56) References Cited

U.S. PATENT DOCUMENTS

| | | | | |
|---|---|---|---|---|
| 4,910,471 | A * | 3/1990 | Brahmbhatt | H03K 3/0315 331/108 A |
| 7,095,260 | B2 * | 8/2006 | Miyata | H03C 3/095 327/156 |
| 7,504,897 | B2 * | 3/2009 | Chava | H03K 4/502 327/156 |
| 2002/0171457 | A1 * | 11/2002 | Fujiwara | H03K 3/0231 327/113 |
| 2007/0008018 | A1 * | 1/2007 | Nagashima | H03K 3/84 327/106 |
| 2013/0187691 | A1 * | 7/2013 | Sreekiran | H03H 11/04 327/157 |
| 2014/0203726 | A1 | 7/2014 | Katsura | |

FOREIGN PATENT DOCUMENTS

JP    2014-143235    8/2014

* cited by examiner

*Primary Examiner* — Ryan Johnson
(74) *Attorney, Agent, or Firm* — Fish & Richardson P.C.

(57) ABSTRACT

An oscillation circuit includes: a periodic signal generator which generates a periodic signal whose frequency varies; and a clock generator which generates a clock signal having a frequency commensurate with the frequency of the periodic signal.

11 Claims, 7 Drawing Sheets

OSCILLATION CIRCUIT

This application is based on Japanese Patent Application No. 2016-023559 filed on Feb. 10, 2016, the contents of which are hereby incorporated by reference.

BACKGROUND OF THE INVENTION

1. Field of the Invention

The present invention relates to oscillation circuits provided with a frequency diffusion function (spread-spectrum function).

2. Description of Related Art

There are conventionally proposed oscillation circuits provided with a function (so-called a frequency diffusion function) whereby the oscillation frequency of a clock signal is varied periodically with a view to reducing noise ascribable to the clock signal.

One example of the prior art mentioned above is seen in Japanese Patent Application filed as No. 2014-143235 by the present inventor.

However, conventionally, the frequency at which the oscillation frequency of the clock signal is varied is constant, and this inconveniently lead to a high noise-level peak at that frequency. As a result, for example, when the oscillation circuit is mounted on a vehicle, it may fail to meet a standard related to EMI (electromagnetic interference) in vehicle-mounted use.

SUMMARY OF THE INVENTION

Against the background discussed above, an object of the present invention is to provide an oscillation circuit that can more properly reduce noise ascribable to a clock signal.

According to one aspect of the present invention, an oscillation circuit includes: a periodic signal generator which generates a periodic signal of which the frequency varies; and a clock generator which generates a clock signal having a frequency commensurate with the frequency of the periodic signal.

DETAILED DESCRIPTION OF PREFERRED EMBODIMENTS

Embodiments of the present invention will be described below with reference to the accompanying drawings. The following description deals with vehicle-mounted use as one example of application of the present invention.

Figure 1:
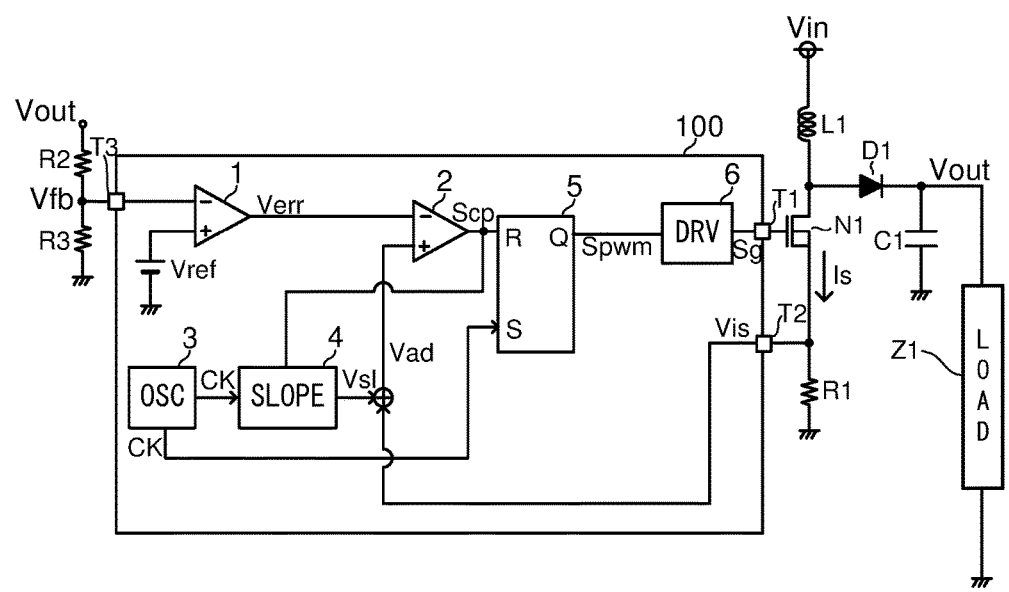
FIG. 1 is a block diagram showing one configuration example of a vehicle-mounted switching power supply device.

Vehicle-Mounted LED Driver IC:

FIG. 1 is a block diagram showing one configuration example of a vehicle-mounted switching power supply device. The switching power supply device 50 according to this configuration example includes a switching driver IC 100 and discrete components arranged outside it, namely a coil L1, a transistor N1, a diode D1, a capacitor C1, and resistors R1 to R3. The switching driver IC 100 (hereinafter abbreviated to "IC 100") is a silicon monolithic semiconductor integrated circuit having integrated into it an error amplifier 1, a comparator 2, an oscillation circuit 3, a slope voltage generator 4, an RS flip-flop 5, and a driver 6.

The IC 100 further has, as means for establishing electrical connection with the outside, external terminals T1 to T3. In the exemplary vehicle-mounted use shown in FIG. 1, to the IC 100 are externally connected the coil L1, the transistor N1, which is an N-channel MOSFET (metal-oxide-semiconductor field-effect transistor), the resistors R1 to R3, the diode D1, the capacitor C1, and a load Z1. The components shown in FIG. 1 except the load Z1 constitute a step-up switching power supply device 50 which steps up an input voltage Vin to generate an output voltage Vout. Although the switching power supply device 50 adopts so-called current-mode control as a feedback method, but may instead adopt voltage-mode control.

The load Z1 is, for example, a liquid crystal display driver (such as a source driver or a gate driver) in a vehicle-mounted liquid crystal display device, or a vehicle-mounted CPU (central processing unit).

To one terminal of the coil L1, the input voltage Vin is applied. The input voltage Vin is generated, for example, by an unillustrated battery. The other terminal of the coil L1 is connected to the drain of the transistor N1 and to the anode of the diode D1. The gate of the transistor N1 is connected to the external terminal T1 The source and the backgate of the transistor N1 are connected to one terminal of the resistor R1. The other terminal of the resistor R1 is connected to a ground terminal.

The cathode of the diode D1 is connected to one terminal of the capacitor C1. The other terminal of the capacitor C1 is connected to the ground terminal. The connection node between the diode D1 and the capacitor C1 is connected to the load Z1. At the connection node between the diode D1 and the capacitor C1, the output voltage Vout appears. The connection node between the diode D1 and the capacitor C1 is connected also to one terminal of the resistor R2. The other terminal of the resistor R2 is connected to one terminal of the resistor R3. The other terminal of the resistor R3 is connected to the ground terminal. The connection node between the resistors R2 and R3 is connected to the external terminal T3. The output voltage Vout is divided by the resistors R2 and R3 to generate a feedback voltage Vfb, which is applied to the external terminal T3.

Next, the circuit blocks that are integrated into the IC 100 will be described in outline one by one.

The error amplifier 1 generates an error voltage Verr according to the difference between a reference voltage Vref, which is applied to the non-inverting input terminal (+) of the error amplifier 1, and the feedback voltage Vfb, which is applied to an inverting input terminal (−) of the error amplifier 1.

In a case where the IC 100 is furnished with a soft starting function, another non-inverting input terminal may be added to the error amplifier 1 so that a soft starting voltage that is different from the reference voltage Vref may be applied to this non-inverting input terminal. In that case, the error amplifier 1 generates the error voltage Verr according to the difference between whichever is lower of the voltages applied to the two non-inverting input terminals and the feedback voltage Vfb. When the IC 100 starts up, the soft starting voltage rises more gently than the reference voltage Vref to eventually reach a voltage value higher than that of the reference voltage Vref. Accordingly, during the start-up of the IC 100, output feedback control (soft starting control) is performed such that the feedback voltage Vfb remains equal to the soft starting voltage, and this prevents a rush current into the capacitor C1 and the load Z1.

The oscillation circuit 3 generates a clock signal CK. The oscillation circuit 3 has a frequency diffusion function whereby the oscillation frequency of the clock signal CK is varied periodically. The configuration and operation of the oscillation circuit 3 will be described in detail later.

The slope voltage generator 4 generates a slope voltage Vs1 with a saw-tooth waveform by using the clock signal CK.

The switching current Is through the transistor N1 is detected by the resistor R1 to generate a detection voltage Vis, which appears at the external terminal T2. The slope voltage Vs1 and the detection voltage Vis are added up to generate a sum voltage Vad. The comparator 2 generates a comparison signal Scp by comparing the error voltage Verr, which is applied to the inverting input terminal (−) of the comparator 2, and the sum voltage Vad, which is applied to the non-inverting input terminal (+).

To the set terminal (S) of the RS flip-flop 5, the clock signal CK generated by the oscillation circuit 3 is applied. To the reset terminal (R) of the RS flip-flop 5, the comparison signal Scp generated by the comparator 2 is applied. The RS flip-flop 5 outputs a PWM (pulse width modulation) signal Spwm according to the inputs to the reset and set terminals.

The driver 6 generates a gate signal (switching signal) Sg according to the PWM signal Spwm, and applies the gate signal Sg to the gate of the transistor N1 via the external terminal T1, thereby to turn the transistor N1 ON and OFF.

In addition to the components shown in FIG. 1, the IC 100 may include a reference voltage generator which generates an internal reference voltage from the input voltage Vin. The IC 100 may further include, to perform protective functions, a reduced-voltage detector, an abnormal temperature detector, an overvoltage detector, an overcurrent detector, an LED open/short detector, and the like.

Figure 2:
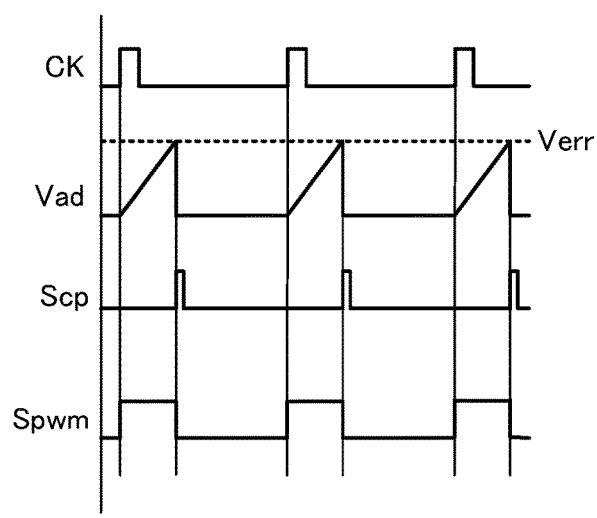
FIG. 2 is a timing chart showing one example of the operation of a vehicle-mounted switching power supply device.

FIG. 2 is a timing chart showing one example of the operation of the IC 100. FIG. 2 shows, from top down, the clock signal CK, the sum voltage Vad (which equals the slope voltage Vs1 plus the detection voltage Vis), the comparison signal Scp, and the PWM signal Spwm.

When the clock signal CK rises, the slope voltage Vs1 starts to increase with a gradient. At this time, the clock signal applied to the set terminal causes the PWM signal Spwm output from the Q terminal of the RS flip-flop 5 to rise to HIGH level.

When the PWM signal Spwm turns to HIGH level, the gate signal Sg generated by the driver 6 turns to HIGH level, and the transistor N1 turns ON. Thus, a switching current Is starts to pass, and the detection voltage Vis starts to increase. Thus, also the sum voltage Vad, which is generated by adding up the slope voltage Vs1 and the detection voltage Vis, starts to increase.

During the period in which the sum voltage Vad is lower than the error voltage Verr, the comparison signal Scp remains at LOW level. When the sum voltage Vad has increased to reach the error voltage Verr, the comparison signal Scp turns to HIGH level. This resets the RS flip-flop 5, with the result that the PWM signal Spwm output from the Q terminal turns to LOW level, and also the gate signal Sg turns to LOW level. Thus, the transistor N1 turns OFF.

At this time, the switching current Is is shut off, and the detection voltage Vis is reset. Moreover, the slope voltage generator 4 detects the comparison signal Scp having turned to HIGH level, and resets the slope voltage Vs1. Accordingly, the sum voltage Vad is reset, and the comparison signal Scp turns to LOW level. Thereafter, every time the clock signal CK rises, similar operation repeats.

According to the error voltage Verr generated based on the feedback voltage Vfb and the reference voltage Vref, the ON duty of the PWM signal Spwm is controlled, and thereby the feedback voltage Vfb is controlled to remain equal to the reference voltage Vref Thus, the output voltage Vout is controlled to remain constant, and is supplied to the load Z1.

Although FIG. 1 deals with an example where the output stage composed of the discrete components (the coil L1, transistor N1, diode D1, capacitor C1, and resistors R1 to R3) is configured as a step-up type, this is not meant to limit the configuration of the output stage; any of a step-down type, a step-up/down type, and an SEPIC type can be equally coped with easily.

First Embodiment of the Oscillation Circuit

Figure 3:
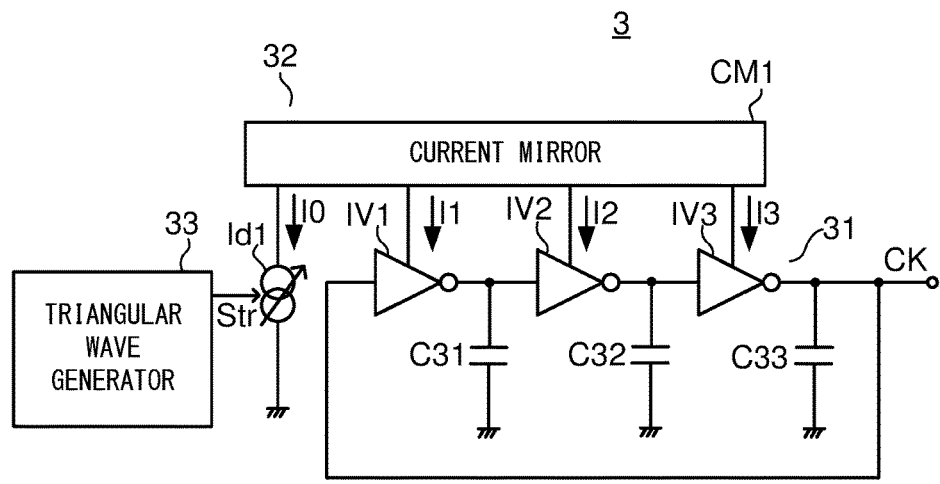
FIG. 3 is a circuit configuration diagram showing the configuration of an oscillation circuit according to a first embodiment of the present invention.

Next, a first embodiment of the oscillation circuit 3 will be described. FIG. 3 is a circuit configuration diagram showing the configuration of the oscillation circuit 3 according to the first embodiment. The oscillation circuit 3 shown in FIG. 3 includes a ring oscillator 31, a variable-current feeder 32, and a triangular wave generator (periodic signal generator) 33. Here, the ring oscillator 31 and the variable-current feeder 32 constitute a clock generator which generates the clock signal CK.

The ring oscillator 31 is composed of inverters IV1 to IV3 and capacitors C31 to C33. The output terminal of the inverter IV1 is connected to one terminal of the capacitor C31 and to the input terminal of the inverter IV2. The other terminal of the capacitor C31 is connected to the ground terminal. The output terminal of the inverter IV2 is connected to one terminal of the capacitor C32 and to the input terminal of the inverter IV3. The other terminal of the capacitor C32 is connected to the ground terminal. The output terminal of the inverter IV3 is connected to one terminal of the capacitor C33. The other terminal of the capacitor C33 is connected to the ground terminal. The output terminal of the inverter IV3 is connected to the input terminal of the inverter IV1. Thus, the inverters IV1 to IV3 are connected together in a ring form. The number of inverters is not limited to three as in this embodiment, but may instead be any odd number of five or more.

The variable-current feeder 32 is composed of a current-output DAC (digital-to-analog converter) Id1 and a current mirror circuit CM1. The current-output DAC Id1 subjects a triangular wave signal Str generated by the triangular wave generator 33 to digital-to-analog conversion, and outputs the result as a current I0. The current mirror circuit CM1 mirrors the current I0 so as to feed currents I1 to I3 to the inverters IV1 to IV3 respectively. The inverters IV1 to IV3 are each composed of a P-channel MOSFET and an N-channel MOSFET (neither is illustrated) that are connected in series between to a line to which the corresponding one of the currents I1 to I3 is fed and the ground terminal.

According to the current I0 generated by the current-output DAC Id1, the currents I1 to I3 are generated, and according to the currents I1 to I3, the charging speeds of the capacitors C31 to C33 are controlled and the output delays in the inverters IV1 to IV3 are controlled; thereby the frequency of the clock signal CK output from the inverter IV3 is controlled. Thus, the frequency of the clock signal CK is variable according to the current I0. The higher the current I0, the smaller the delays in the inverters IV1 to IV3, and thus the higher the frequency of the clock signal CK.

Figure 5:
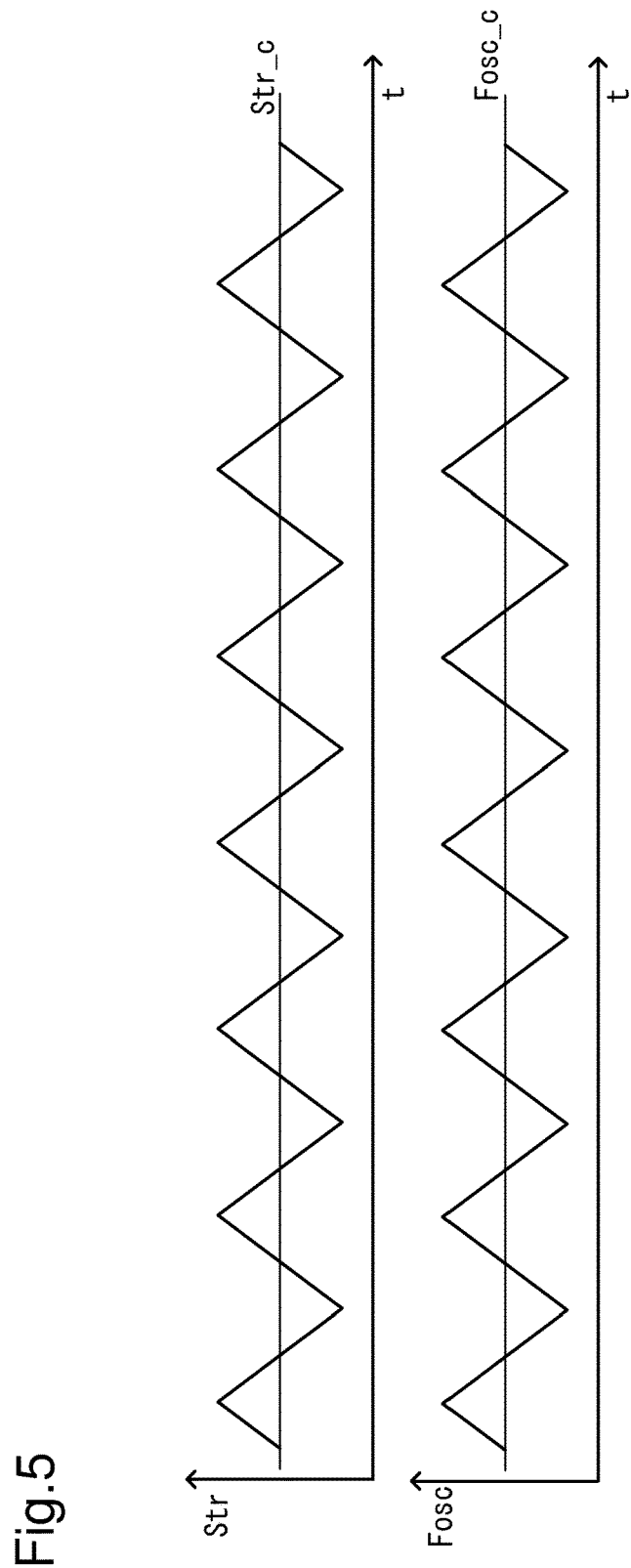
FIG. 5 is a timing chart showing the waveform of a triangular wave signal, and the waveform of the frequency of a clock signal, in a comparative example.

Here, suppose, for discussion's sake, that, as shown in the upper row of FIG. 5, the triangular wave signal Str is a signal with a constant frequency. In that case, the current I0 has a waveform similar to that of the triangular wave signal Str, and has a constant frequency. Accordingly, as shown in the lower row of FIG. 5, the frequency Fosc of the clock signal CK describes a triangular waveform of which the frequency is constant.

Figure 7:
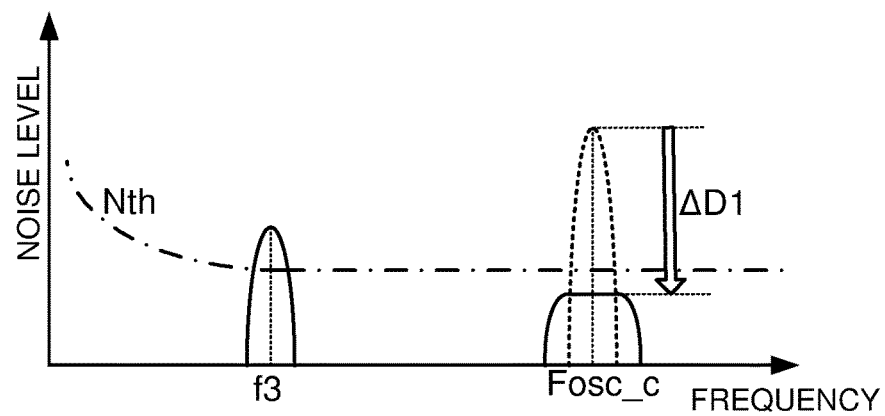
FIG. 7 is a diagram showing one example of how noise is reduced through frequency diffusion in a comparative example.

FIG. 7 shows one example of the relationship between frequency and noise level. When, for discussion's sake, the frequency Fosc of the clock signal CK is constant at a frequency Fosc_c, then, as indicated by a broken line in FIG. 7, the peak value of the noise level around the frequency Fosc_c is high, and exceeds the permissible threshold Nth (indicated by a dash-and-dot line). The permissible threshold Nth is a permissible threshold for noise level as defined in a standard relating to EMI in vehicle-mounted appliances. The permissible threshold Nth is, for example, low in the AM (amplitude modulation) frequency band to the FM (frequency modulation) frequency band and high in a frequency band lower than the AM frequency band.

Here, in a case where, as shown in the lower row of FIG. 5, the frequency Fosc of the clock signal CK is diffused to swing up and down about the frequency Fosc_c at the center, then, as indicated by a solid line in FIG. 7, the peak value of the noise level around the frequency Fosc_c can be reduced by an attenuation amount ΔD1. This makes it possible to reduce the peak value of the noise level down to the permissible threshold Nth or less.

However, since the frequency at which the frequency Fosc varies in a triangular waveform is constant, let that frequency be f3, then, as indicated by the solid line in FIG. 7, the peak value of the noise level around the frequency f3, which is lower than the frequency Fosc_c, is high, and exceeds the permissible threshold Nth.

Figure 6:
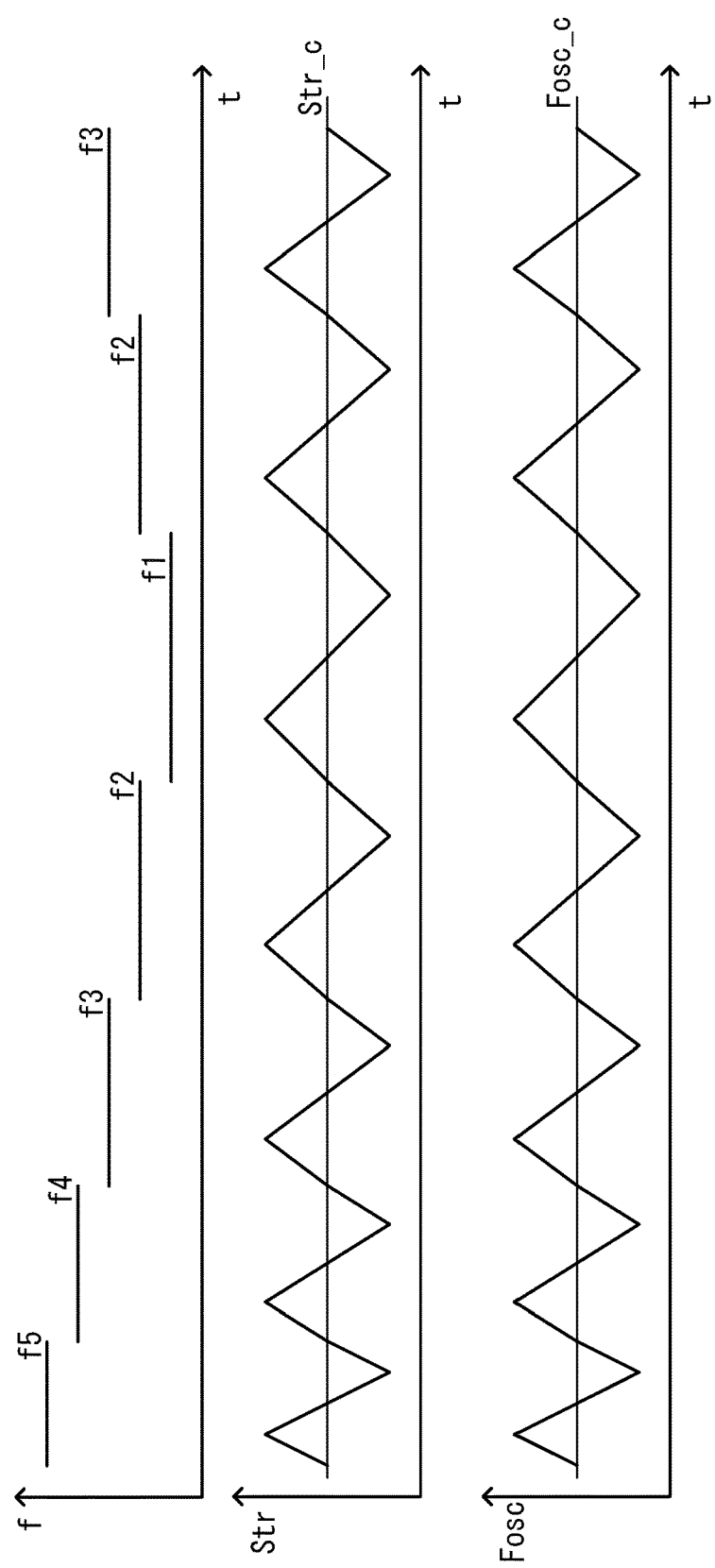
FIG. 6 is a timing chart showing the waveform of a triangular wave signal, and the waveform of the frequency of a clock signal, in an embodiment of the present invention.

As a solution, in this embodiment, the triangular wave generator 33 is configured to vary the level of a frequency f periodically, for example, as shown in the upper row of FIG. 6, from f5 to f4 to f3 to f2 to f1 to f2 to f3 to f4 to f5 (where f5>f4>f3>f2>f1), and the frequency of the triangular wave signal Str is varied to follow the frequency f (as shown in the middle row of FIG. 6). Then, as shown in the lower row of FIG. 6, the oscillation frequency Fosc of the clock signal CK varies in a triangular waveform, and the frequency of this variation varies.

Figure 8:
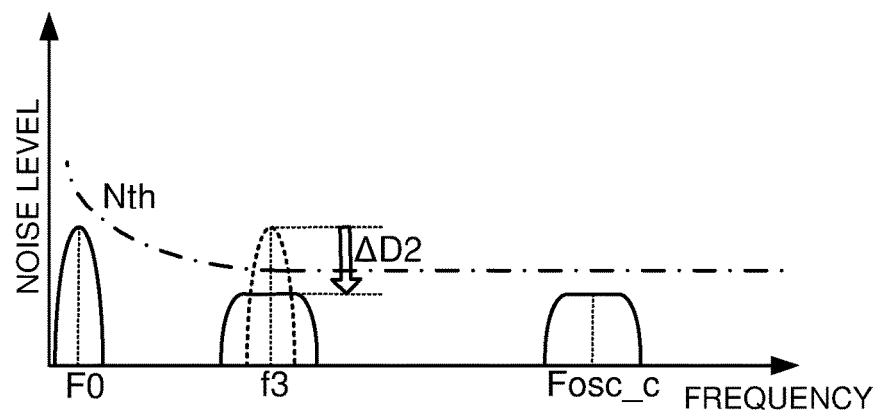
FIG. 8 is a diagram showing one example of how noise is reduced through frequency diffusion in an embodiment of the present invention.

Since, as shown in the lower row of FIG. 6, the frequency Fosc of the clock signal CK is diffused to swing up and down about the frequency Fosc_c at the center, as indicated by a solid line in FIG. 8, the peak value of the noise level around the frequency Fosc_c can be reduced down to the permissible threshold Nth or less. Moreover, since the frequency at which the frequency Fosc varies varies between f1 and f5 with f3 at the center, as indicated by the solid line in FIG. 8, the peak value of the noise level around the frequency f3 can be reduced by an attenuation amount ΔD2 from the peak value shown in FIG. 7 (indicated the broken line in FIG. 8) so as to be reduced down to the permissible threshold Nth or less.

Here, the frequency at which the frequency f varies is constant, and let this frequency be F0, then, as shown in FIG. 8, the peak value of the noise level around the frequency F0, which is lower than f3, is comparatively high. However, since the permissible threshold Nth is high in a low frequency band, the above-mentioned peak value can be reduced down to the permissible threshold Nth or less. Thus, according to this embodiment, it is possible to more properly reduce the level of noise ascribable to the clock signal CK.

As shown in the middle row of FIG. 6, the triangular wave signal Str has a waveform that swings up and down about a predetermined level Str_c, and the areas that the waveform occupies on the upper and lower sides, respectively, of the predetermined level Str_c are made equal. Thus, also the areas that the waveform of which the frequency equals Fosc occupies on the upper and lower sides, respectively, of the frequency Fosc_c are equal. Accordingly, the switching frequency of the IC 100 based on the clock signal CK equals frequency Fosc_c in average terms, which is suitable.

Instead of the triangular wave signal Str, any other periodic signal may be used; for example, a sine wave signal may be used.

The frequency f may be varied other than periodically; it may instead be varied by use of a random function.

The frequency at which the frequency f is varied periodically does not necessarily has to be constant but may instead be varied (the variation may be periodic or random). This makes it possible to reduce the peak value of the noise level at the frequency at which the frequency f is varied (for example, in a band around the frequency F0 in FIG. 8).

Second Embodiment of the Oscillation Circuit

Figure 4:
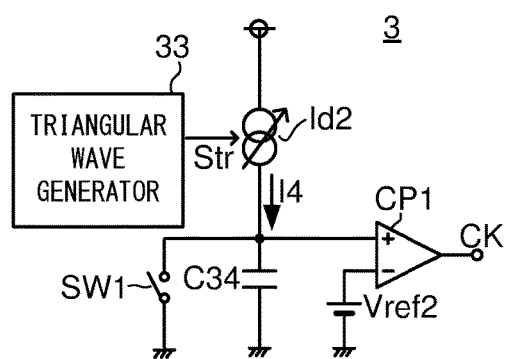
FIG. 4 is a circuit configuration diagram showing the configuration of an oscillation circuit according to a second embodiment of the present invention.

Next, a second embodiment of the oscillation circuit 3 will be described. FIG. 4 is a circuit configuration diagram showing the configuration of the oscillation circuit 3 according to the second embodiment. The oscillation circuit 3 shown in FIG. 4 includes a current-output DAC Id2, a switch SW1, a capacitor C34, a comparator CP1, and a triangular wave generator (periodic signal generator) 33. Here, the current-output DAC Id2, the switch SW1, the capacitor C34, and the comparator CP1 constitute a clock generator which generates the clock signal CK.

One terminal of the switch SW1 and one terminal of the capacitor C34 are connected to the current-output DAC Id2. The other terminal of the switch SW1 and the other terminal of the capacitor C34 are connected to the ground terminal. The connection node between the switch SW1 and the capacitor C34 is connected to the non-inverting input terminal (+) of the comparator CP1. To the inverting input terminal (−) of the comparator CP1, a reference voltage Vref2 is applied.

The current-output DAC Id2 subjects the triangular wave signal Str generated by the triangular wave generator 33 to digital-to-analog conversion, and outputs the result as a current I4. As the switch SW1 is turned ON and OFF repeatedly, the capacitor C34 is charged and discharged repeatedly, and the comparator CP1 outputs the clock signal CK.

According to the current I4, the charging speed of the capacitor C34 is controlled, and the frequency of the clock signal CK is controlled. That is, the frequency of the clock signal CK is variable according to the triangular wave signal Str. The higher the current I4, the higher the frequency of the clock signal CK.

Also in this embodiment, as in the first embodiment, the triangular wave signal Str is given as a triangular wave of which the frequency varies as shown in FIG. 6. Thus, the current I4 has a waveform similar to that of the triangular wave signal Str, and the frequency Fosc of the clock signal CK describes a triangular waveform of which the frequency varies.

Thus, also in this embodiment, as in the first embodiment, it is possible, in the frequency diffusion function, to properly reduce the peak value of noise level. Incidentally, to generate a high-frequency clock signal CK, it is more suitable to use a ring oscillator as in the first embodiment.

The modified examples described previously in connection with the first embodiment can be applied equally to the second embodiment.

Figure 9:
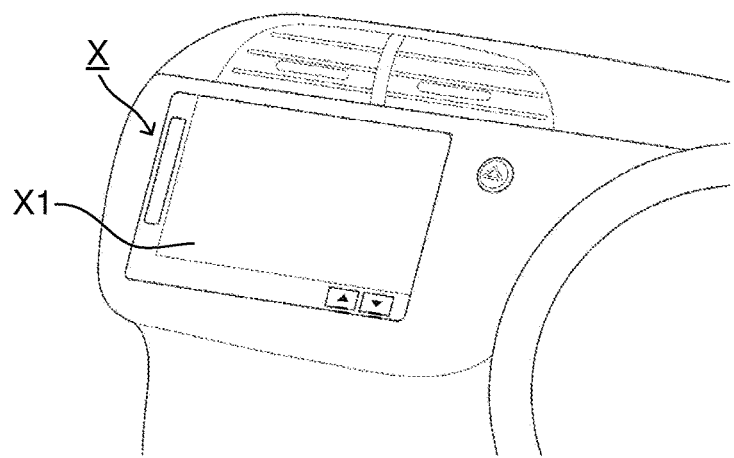
FIG. 9 is an exterior view showing one example of a vehicle-mounted liquid crystal display device.

Vehicle-Mounted Liquid Crystal Display Device:

The switching power supply device 50 can be suitably applied to, for example, a liquid crystal display device X that is mounted on a vehicle as shown in FIG. 9. On a liquid crystal panel X1 provided in the liquid crystal display device X is displayed, for example, navigation information, the image of the rearward view of the vehicle, and the like. In this case, the switching power supply device 50 supplies the output voltage Vout to a load Z1 such as a source driver, gate driver, or the like that drives the liquid crystal panel X1.

Other Modifications:

The present invention can be implemented in any manner other than as specifically described above by way of embodiments, and allows for many modifications within the spirit of the invention. For example, although the above embodiments deal with, as examples, configurations where the present invention is applied to a vehicle-mounted switching power supply device, this is not meant to limit the application of the present invention; it finds application in oscillation circuits provided with a frequency diffusion function in general, such as oscillation circuits used in switching power supply devices for driving display panels in television receivers, tablets, and the like.

As just mentioned, the embodiments described above should be considered in every aspect illustrative and not restrictive, and it should be understood that the technical scope of the present invention is defined not by the description of embodiments given above but by the appended claims and encompasses any modifications made in the scope and sense equivalent to those of the claims.

What is claimed is:
1. An oscillation circuit comprising:
    a periodic signal generator configured to generate a periodic signal of which a frequency varies; and
    a clock generator configured to generate a clock signal having a frequency commensurate with a value of the periodic signal,
    wherein the frequency of the periodic signal varies periodically by first decreasing from a maximum value via a center value to a minimum value and then increasing from the minimum value via the center value to the maximum value, and
    a frequency at which the frequency of the periodic signal is varied periodically varies.
2. The oscillation circuit of claim 1, wherein the periodic signal is a triangular wave signal.
3. The oscillation circuit of claim 2, wherein the triangular wave signal has a waveform that swings up and down about a predetermined level as a center.
4. The oscillation circuit of claim 1, wherein the clock generator includes:
    a ring oscillator having
        an odd number of inverters connected in a ring form and
        capacitors connected to output terminals of the inverters respectively; and
    a variable current feeder configured to feed the inverters with a current commensurate with the periodic signal.
5. The oscillation circuit of claim 4, wherein the variable current feeder includes:
    a current-output DAC configured to subject the periodic signal to digital-to-analog conversion to output a current; and
    a current mirror configured to mirror the current output from the current-output DAC to feed the current to the inverters.
6. The oscillation circuit of claim 1, wherein the clock generator includes:
    a current-output DAC configured to subject the periodic signal to digital-to-analog conversion to output a current; and
    a capacitor configured to be charged by the current output from the current-output DAC;
    a switch configured to be turned ON and OFF to charge and discharge the capacitor; and
    a comparator configured to be fed with a voltage of the capacitor and a reference voltage.
7. A semiconductor device comprising:
    the oscillation circuit of claim 1 for generating a clock signal, wherein
    the semiconductor device generates a switching signal for a switching power supply device by using the clock signal.
8. A display device comprising:
    a switching power supply device including the semiconductor device of claim 7; and
    a display configured to be supplied with electric power from the switching power supply device.
9. The display device of claim 8, wherein the display device is for vehicle-mounted use.
10. The semiconductor device of claim 7, wherein the semiconductor device is for vehicle-mounted use.
11. The oscillation circuit of claim 1, wherein the oscillation circuit is for vehicle-mounted use.

* * * * *